US008637212B2

(12) United States Patent
Gaskins

(10) Patent No.: US 8,637,212 B2
(45) Date of Patent: Jan. 28, 2014

(54) RETICLE SET MODIFICATION TO PRODUCE MULTI-CORE DIES

(75) Inventor: Darius D. Gaskins, Austin, TX (US)

(73) Assignee: VIA Technologies, Inc., New Taipei (TW)

( * ) Notice: Subject to any disclaimer, the term of this patent is extended or adjusted under 35 U.S.C. 154(b) by 231 days.

(21) Appl. No.: 13/299,171

(22) Filed: Nov. 17, 2011

(65) Prior Publication Data

US 2012/0161328 A1    Jun. 28, 2012

Related U.S. Application Data

(60) Provisional application No. 61/426,470, filed on Dec. 22, 2010.

(51) Int. Cl.
G03F 1/70 (2012.01)
G03F 1/68 (2012.01)
G06F 17/50 (2006.01)

(52) U.S. Cl.
USPC .................................. 430/5; 716/55

(58) Field of Classification Search
CPC ........................................................ G03F 1/70
USPC .................................. 430/5; 716/55
See application file for complete search history.

(56) References Cited

U.S. PATENT DOCUMENTS

| | | |
|---|---|---|
| 6,665,802 B1 | 12/2003 | Ober |
| 6,968,467 B2 | 11/2005 | Inoue et al. |
| 7,257,679 B2 | 8/2007 | Clark |
| 7,451,333 B2 | 11/2008 | Naveh et al. |
| 8,359,436 B2 | 1/2013 | Vash et al. |
| 2006/0282692 A1 | 12/2006 | Oh |
| 2007/0070673 A1 | 3/2007 | Borkar et al. |
| 2007/0143514 A1 | 6/2007 | Kaushik et al. |
| 2007/0266262 A1 | 11/2007 | Burton et al. |
| 2008/0129274 A1 | 6/2008 | Komaki |
| 2009/0172423 A1 | 7/2009 | Song et al. |
| 2009/0233239 A1 | 9/2009 | Temchenko et al. |
| 2010/0058078 A1 | 3/2010 | Branover et al. |
| 2010/0138683 A1 | 6/2010 | Burton et al. |
| 2011/0265090 A1 | 10/2011 | Moyer et al. |
| 2012/0005514 A1 | 1/2012 | Henry et al. |

(Continued)

OTHER PUBLICATIONS

"Intel® Core™ 2 Extreme Quad-Core Mobile Processor and Intel® Core™ 2 Quad Mobile Processor on 45-nm Process." Datasheet. For platforms based on Mobile Intel® 4 Series Express Chipset Family. Jan. 2009 Document No. 320390-002 pp. 1-72.

(Continued)

*Primary Examiner* — Mark F Huff
*Assistant Examiner* — John S Ruggles
(74) *Attorney, Agent, or Firm* — E. Alan Davis; James W. Huffman

(57) ABSTRACT

A first reticle set designed for manufacturing dies with a limited number of cores is modified into a second reticle set suitable for manufacturing at least some dies with at least twice as many cores. The first reticle set defines scribe lines to separate the originally defined dies. At least one scribe line is removed from pairs of adjacent but originally distinctly defined dies. Inter-core communication wires are defined to connect the adjacent cores, which are configured to enable the adjacent cores to communicate during operation without connecting to any physical input/output landing pads of the resulting more numerously cored die, which will not carry signals through the inter-core communication wires off the P-core die. The inter-core communication wires may be used for power management coordination purposes or to bypass the external processor bus.

17 Claims, 4 Drawing Sheets

(56) References Cited

U.S. PATENT DOCUMENTS

| | | |
|---|---|---|
| 2012/0166763 A1 | 6/2012 | Henry et al. |
| 2012/0166764 A1 | 6/2012 | Henry et al. |
| 2012/0166832 A1 | 6/2012 | Henry et al. |
| 2012/0166837 A1 | 6/2012 | Henry et al. |
| 2012/0166845 A1 | 6/2012 | Henry et al. |
| 2012/0239847 A1 | 9/2012 | Gaskins |

OTHER PUBLICATIONS

"Intel® Atom™ Processor 330^A Series." Datasheet. For systems based on Nettop Platform for '08. Revision 002. Feb. 2009. Document No. 320528-002. pp. 1-50.

"Intel® Core™ 2 Duo Processors and Intel® Core™ 2 Extreme Processors for Platforms Based on Mobile Intel® 965 Express Chipset Family." Datasheet. Jan. 2008. Document No. 316745-005. pp. 1-87.

"Intel® Core™ Duo Processor and Intel® Core™ Solo Processor on 65 nm Processs." Datasheet. Jan. 2007. Document No. 309221-006. pp. 1-91.

Richard, Michael Graham. "Intel's Next CPU to Include Dedicated 'Power Control Unit' to Save Power." Aug. 22, 2008. Downloaded from http://www.treehugger.com/files/2008/08/intel-cpu-processor-nehalem-i7-power-pcu.php on Jul. 14, 2010. pp. 1-4.

Naveh, Alon et al. "Power and Thermal Management in Intel® Core™ Duo Processor." Intel® Technology Journal. vol. 10, Issue 02, Published May 15, 2006. ISSN 1535-864X pp. 109-123.

Glaskowsky, Peter. "Investigating Intel's Lynnfield Mysteries." Mcall.com, CNET News, Speeds and Feeds. Sep. 21, 2009. Downloaded from http://mcall.com/8301-13512_3-10357328-23.html?tag=mncol;txt downloaded on Jul. 14, 2010. pp. 1-4.

Wasson, Scott. "Intel's Core i7 Processors; Nehalem Arrives with a Splash." The Tech Report. Nov. 3, 2008. Downloaded from http://techreport.com/articles.x/15818/1 on Jul. 14, 2010. pp. 1-11.

"Intel® QuickPath Architecture; A New System Architecture." White Paper Document No. 319725-001US. Mar. 2008. pp. 1-6.

Sartori, John et al. "Distributed Peak Power Management for Many-core Architectures." Published in Design, Automation & Test in Europe Conference & Exhibition, Apr. 2009, pp. 1556-1559.

RETICLE SET MODIFICATION TO PRODUCE MULTI-CORE DIES

CROSS REFERENCE TO RELATED APPLICATION(S)

This application claims priority based on U.S. Provisional Application Ser. No. 61/426,470, filed Dec. 22, 2010, entitled MULTI-CORE INTERNAL BYPASS BUS, which is hereby incorporated by reference in its entirety.

This application is related to the following U.S. patent applications which are concurrently filed herewith, each of which is hereby incorporated by reference in its entirety.

| Publication Number | Date | Title |
| --- | --- | --- |
| U.S 2012/0239847 | Sep. 20, 2012 | MULTI-CORE INTERNAL BYPASS BUS |
| U.S 2012/0166845 | Jun. 28, 2012 | POWER STATE SYNCHRONIZATION IN A MULTI-CORE PROCESSOR |
| U.S 2012/0166837 | Jun. 28, 2012 | DECENTRALIZED POWER MANAGEMENT DISTRIBUTED AMONG MULTIPLE PROCESSOR CORES |
| U.S 2012/0166763 | Jun. 28, 2012 | DYNAMIC MULTI-CORE MICROPROCESSOR CONFIGURATION DISCOVERY |
| U.S 2012/0166832 | Jun. 28, 2012 | DISTRIBUTED MANAGEMENT OF A SHARED POWER SOURCE TO A MULTI-CORE MICROPROCESSOR |
| U.S 2012/0166764 | Jun. 28, 2012 | DYNAMIC AND SELECTIVE CORE DISABLEMENT AND RECONFIGURATION IN A MULTI-CORE PROCESSOR |

FIELD OF THE INVENTION

The present invention relates to the field of multi-core microprocessor design.

BACKGROUND OF THE INVENTION

There is a trend in recent years in microprocessor development toward multi-core microprocessors. Time to market and scalability are important considerations in multi-core microprocessor design. Furthermore, the amount of power consumed by the multi-core microprocessor may be considerable, making power management thereof an important consideration. Finally, because the multiple cores typically communicate with one another and with a chipset or other type of memory controller/bus bridge via a common bus, signal quality on the bus may be an important consideration.

BRIEF SUMMARY OF INVENTION

In one aspect the present invention provides a method for printing a multi-core die on a semiconductor wafer by modifying a reticle set useable for manufacturing dies with half as many, or fewer, cores. A first reticle set is developed or obtained that is usable to print Q-core dies, where Q is at least 1. Modifications are made to the first reticle set to develop a second reticle set useable to print P-core dies, where P is at least twice Q. To illustrate, a single-core die would be represented by a Q of 1, a dual-core die would be represented by a Q or P of 2, and a quad-core die would be represented by a Q or P of 4.

The first reticle set defines scribe lines to separate the Q-core dies, and the scribe lines collectively define a seal ring to surround each Q-core die. At least one defined scribe line of the first reticle set is removed, and corresponding inter-core communication wires are defined to connect at least two adjacent cores that would have been separated by the replaced scribe line. The inter-core communication wires are configured to enable the at least two connected cores to communicate during operation. Moreover, the inter-core communication wires are configured to not connect to physical input/output landing pads of the P-core die, such that a P-core die manufactured in accordance with the modified reticle set will not carry signals through the inter-core communication wires off the P-core die.

A semiconductor wafer of multi-core dies is then manufactured using the second reticle set, including printing the multi-core dies on the semiconductor wafer using the second reticle set, and cutting the multi-core dies on the semiconductor wafer along the remaining scribe lines.

In other aspects, the inter-core communication wires are configured for particular purposes. In one aspect, they are configured to enable the cores of the multi-core die to communicate with one another to perform power management of the multi-core die. In a related aspect, the power management comprises synchronizing power state changes by the cores, managing a shared voltage source, and/or managing a shared clock source. In another aspect, the inter-core communication wires define an internal bypass bus by which the cores bypass an external processor bus that interconnects the multi-core die to a chipset. In a related aspect, the cores are configured so that when one of the cores drives the external bus, the other cores listen via the internal bypass bus rather than the external bus.

In another aspect, the second reticle set is develop by modifying less than all of, and more particularly less than half of, the layers of the first reticle set. In a further related aspect, only non-transistor layers of the first reticle set are modified to develop the second reticle set.

In yet further aspects, second reticle sets are developed with specifiable relationships to the first reticle sets. In one aspect, where the first reticle set is usable to print an M×N matrix of Q-core dies. In a more particular aspect, M is an even number at least 2 and N is at least 1, and the second reticle set is developed to print only P-core dies, specifically (N×M)/2 P-core dies. In an alternative aspect, the second reticle set is developed to print both P-core dies and Q-core dies. In a more particular alternative aspect, M is an odd number at least 3 and N is at least 2, and the second reticle set is developed to print M Q-core dies and N×[(M−1)/2] P-core dies. In another more particular alternative aspect, M is an even number at least 4 and N is at least 2, and the second reticle set is developed to print (N×M)/2 Q-core dies and (N×M)/4 P-core dies.

In another aspect, the present invention provides a multi-core die produced by a process as defined above. In a related aspect, the multi-core die employs the inter-core communications for one or more of the particular purposes, as defined above, for which they are configured.

DETAILED DESCRIPTION OF THE INVENTION

Described herein are embodiments of a method for taking a reticle design for a single-core microprocessor and quickly turning it into a reticle design for a dual-core microprocessor. Additionally, embodiments of a method for taking a reticle design for a dual-core microprocessor and quickly turning it into a reticle design for a quad-core microprocessor are described. The notion may be extended to the design of multi-core microprocessors having even more than four processing cores.

Figure 1:
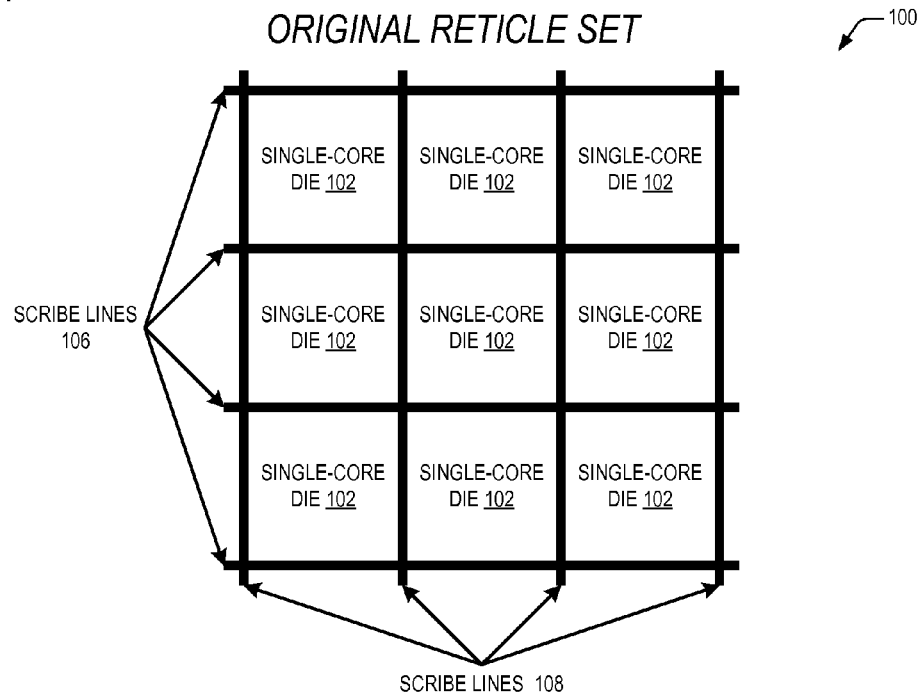
FIG. 1 is a block diagram illustrating an original reticle set used to print a set of single-core dies on a semiconductor wafer according to the present invention.

Referring now to FIG. 1, a block diagram illustrating an original reticle set 100 used to print a set of single-core dies 102 on a semiconductor wafer according to the present invention is shown. The original reticle set 100 comprises a set of individual reticles, or photomasks, each of which is used to print a different layer of a set of the single-core dies 102 according to well-known semiconductor photolithography techniques. For example, individual reticles in the original reticle set 100 may be used to print metal layers, interconnect layers, semiconductor (e.g., silicon) layers, and so forth, to create transistors (or other devices) and to interconnect them.

The original reticle set 100 includes a grid of crossing horizontal scribe lines 106 and vertical scribe lines 108 to define and facilitate physical separation of the single-core dies 102 from each other. For example, the original reticle set 100 of the embodiment of FIG. 1 may be used to print nine single-core dies 102 spatially arranged in a 3×3 matrix of single-core dies 102, as shown. However, other embodiments are contemplated in which the matrix of single-core dies 102 has different dimensions. The scribe lines 106/108 are relatively thick and provide a safe location at which cuts can be made (typically using a wafer dicing saw) to separate the individual single-core dies 102 without jeopardizing the integrity of the dies 102 on either side of the cut. A seal ring refers collectively to the portions of the scribe lines 106/108 that form the four sides of each die 102.

Figure 2:
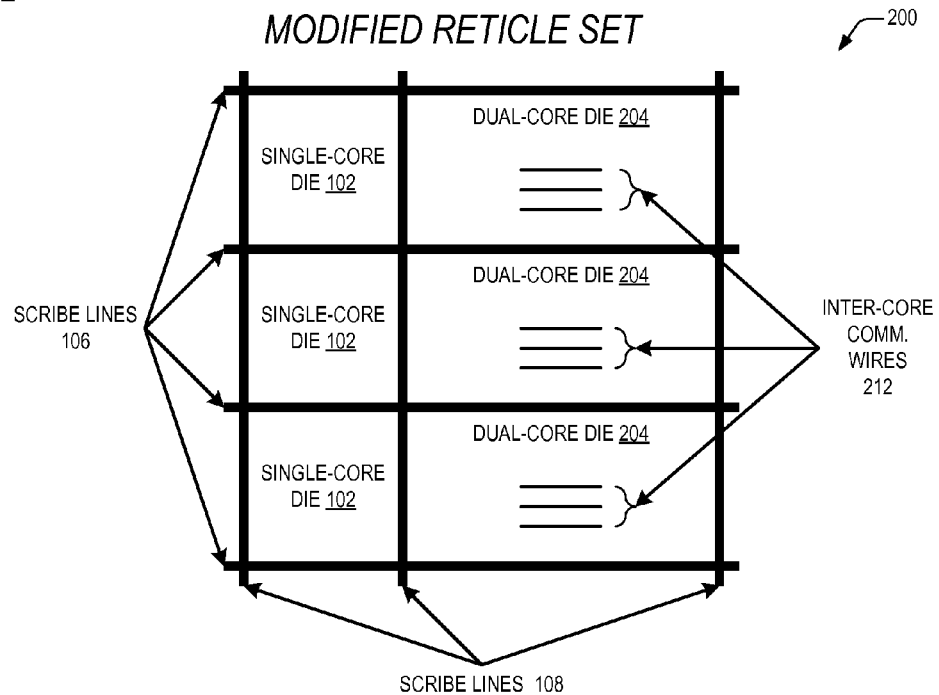
FIG. 2 is a block diagram illustrating a modified reticle set used to print a set of single-core dies and a set of dual-core dies on a semiconductor wafer according to the present invention.

Referring now to FIG. 2, a block diagram illustrating a modified reticle set 200 used to print a set of single-core dies 102 and a set of dual-core dies 204 on a semiconductor wafer according to the present invention is shown. Specifically, the embodiment of FIG. 2 illustrates a set of three single-core dies 102 and a set of three dual-core dies 204. That is, the same number of cores, namely nine, may be printed using both the original reticle set 100 of FIG. 1 and the modified reticle set 200 of FIG. 2; however, the original reticle set 100 of FIG. 1 may be used to print nine dies 102, whereas the modified reticle set 200 of FIG. 2 may be used to print six dies: three single-core dies 102 and three dual-core dies 204. The modified reticle set 200 is similar to the original reticle set 100 of FIG. 1; however, a subset of the individual reticles are modified as described now with respect to the flowchart of FIG. 3 to define inter-core communication wires 212.

Figure 3:
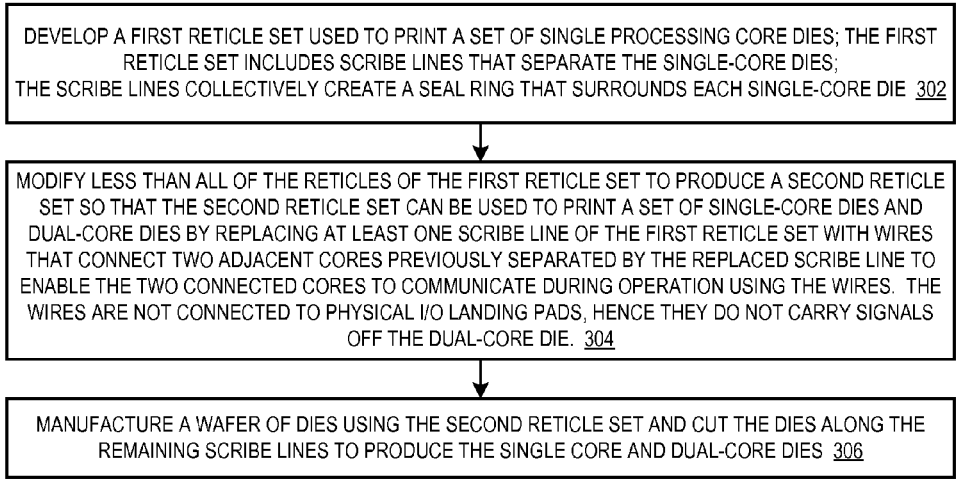
FIG. 3 is a flowchart illustrating steps for modifying the original reticle set of FIG. 1 to produce the modified reticle set of FIG. 2 according to the present invention.

Referring now to FIG. 3, a flowchart illustrating steps for modifying the original reticle set 100 of FIG. 1 to produce the modified reticle set 200 of FIG. 2 according to the present invention is shown. Flow begins at block 302.

At block 302, the designers develop a first reticle set, such as the original reticle set 100 of FIG. 1, used to print a set of single-core dies, such as the single-core dies 102 of FIG. 1. The first reticle set includes scribe lines to define and facilitate separation of the single-core dies and to collectively create a seal ring that surrounds each single-core die. Flow proceeds to block 304.

At block 304, the designers modify less than all of the reticles of the first reticle set produced according to block 302 to produce a second reticle set, such as the reticle set 200 of FIG. 2, so that the second reticle set can be used to print a set of single-core dies and a set of dual-core dies, such as the single-core dies 102 and dual-core dies 204 of FIG. 2, by removing at least one scribe line, such as one of the scribe lines 108 of FIG. 1, and modifying corresponding portions of the reticle set to define wires, such as the inter-core communication wires 212 of FIG. 2, to connect two adjacent cores that would have been separated by the removed scribe lines. Stated alternatively, the modification to the reticle subset removes the portion of the seal ring that would have separated two adjacent dies and defines inter-core communication wires 212 that allow the two cores to communicate with one another (e.g., for restricted operational or power state synchronization or bus bypass purposes, as discussed in more detail below). Thus, in the modified reticle set 200 of FIG. 2 for example, since there is now no scribe line 108 between the two adjacent cores, the modified reticle set 200 now defines a single dual-core die 204 created from what was previously two single-core dies 102. It is noted that the seal rings are left fully intact between the remaining cores, i.e., the cores of the single-core dies, such as single-core dies 102 of FIG. 2.

In one embodiment, the inter-core communication wires 212 between the two cores embody a comprehensive (or relatively so) parallel bypass bus, with multiple inter-core communication wires enabling inter-core communications of each of a large relevant set of processor bus signals. An example of such a parallel bypass bus is described in more detail in the section of Ser. No. 61/426,470, filed Dec. 22, 2010, entitled "Multi-Core Internal Bypass Bus" Ser. No. 13/299,014, which is incorporated herein by reference.

In another embodiment, the inter-core communication wires 212 between the two cores comprise a smaller set of wires. For example, the section of Ser. No. 61/426,470, filed Dec. 22, 2010, entitled "Distributed Management of a Shared Power Source to a Multi-Core Processor" Ser. No. 13/299,225, describes a relatively small set of inter-core communication wires 212 that exchange each core's desired voltage ID (VID) value with the other. Even smaller sets of inter-core communication wires 212 could be accommodated using, for example, a serial interface like that described for inter-die communications in FIG. 2 of Ser. No. 13/299,225.

The inter-core communication wires 212 enable the two connected cores to communicate during operation. The wires 212 are not connected to physical I/O landing pads of the dual-core die; hence, they do not carry signals off the dual-core die. As discussed above, in one embodiment, the first reticle set is a 3×3 matrix of single-core dies, and the second reticle set produces three dual-core dies and three single-core dies. More generally, the first reticle set is an M×N matrix of single-core dies. If M is an odd number, the second reticle set produces N×[(M−1)/2] dual-core dies and N single-core dies, an example of which is shown in the embodiment of FIG. 2. If M is an even number, the second reticle set produces (N×M)/4 dual-core dies and (N×M)/2 single-core dies; alternatively, the second reticle set produces (N×M)/2 dual-core dies, as described with respect to block 404 of the flowchart of FIG. 4. Flow proceeds to block 306.

At block 306, a manufacturer manufactures a wafer of dies using the second reticle set produced according to block 304. The manufacturer then cuts the dies along the remaining scribe lines to produce the single-core and dual-core dies. Alternatively, the manufacturer uses the second reticle set to produce all dual-core dies, as described with respect to block 406 of the flowchart of FIG. 4. Flow ends at block 306.

Broadly speaking, according to one embodiment, a non-full height seal ring is created around each individual core of the dual-core dies 204 and a full height seal ring is created around the entire dual-core die 204.

Figure 4:
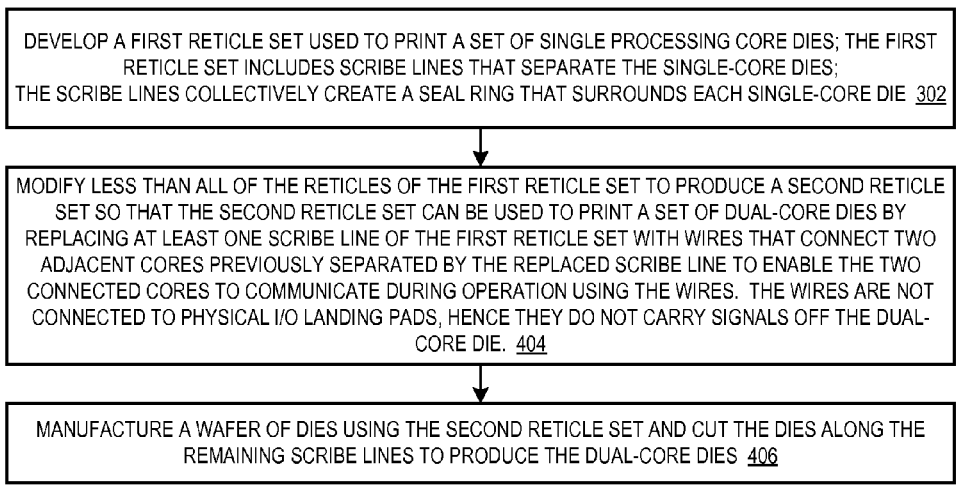
FIG. 4 is a flowchart illustrating steps for modifying the original reticle set of FIG. 1 to produce a modified reticle set for producing all dual-core dies according to the present invention.

Referring now to FIG. 4, a flowchart illustrating steps for modifying the original reticle set 100 of FIG. 1 to produce a modified reticle set for producing all dual-core dies according to the present invention is shown. Flow begins at block 302, which is similar to block 302 of FIG. 3; flow proceeds from block 302 to block 404.

At block 404, the designers modify less than all of the reticles of the first reticle set produced according to block 302 to produce a second reticle set so that the second reticle set can be used to print a set of dual-core dies, such as the dual-core dies 204 of FIG. 2, by removing at least one scribe line, such as one of the scribe lines 108 of FIG. 1, and modifying corresponding portions of the reticle set to define wires, such as the inter-core communication wires 212 of FIG. 2, that connect two adjacent cores that would have otherwise been separated by the removed scribe lines. Stated alternatively, the modification to the reticle subset removes the portion of the seal ring that would have separated two adjacent dies and defines the inter-core communication wires 212 that allow the two cores to communicate with one another (e.g., for restricted operational or power state synchronization or bus bypass purposes, as discussed in more detail below). Thus, the modified reticle set, which now has no scribe line 108 between the two adjacent cores, defines a single dual-core die 204 created from what was previously two single-core dies 102. The wires 212 enable the two connected cores to communicate during operation. The wires 212 are not connected to physical I/O landing pads of the dual-core die; hence, they do not carry signals off the dual-core die. The embodiment of FIG. 4 is relevant for modifying a first reticle set that may be used to print an M×N matrix of single-core dies in which M is an even number such that the modified second reticle set produces (N×M)/2 dual-core dies. Flow proceeds to block 406.

At block 406, a manufacturer manufactures a wafer of dies using the second reticle set produced according to block 404. The manufacturer then cuts the dies along the remaining scribe lines to produce the dual-core dies. Flow ends at block 406.

Various uses of the inter-core communication wires 212 are described herein; however, the uses are not limited to those described. One use is to provide an internal bypass bus on the inter-core communication wires 212 to overcome poor signal quality of an external processor bus that interconnects the cores and other system components such as the chipset. In the bypass bus described in Ser. No. 13/299,014, when one core detects that the other core on its die is driving the external bus, the one core listens to the other core via the internal bypass bus rather than the external bus. Another use is to provide sideband communication wires to facilitate a multi-core power management scheme for functions such as shared voltage identifier (VID), phase-locked loop (PLL) change coordination, and C-state (power state) transition synchronization. Uses of inter-core communication wires 212 for such purposes are described in more detail in Ser. No. 13/299,225 and the section of Ser. No. 61/426,470, filed Dec. 22, 2010, entitled "Decentralized Power Management Distributed Among Multiple Processor Cores" Ser. No. 13/299,122, which is also incorporated herein by reference.

According to a more advanced reticle modification embodiment, a first reticle set is provided for printing a 3×3 matrix of single-core dies, referred to as core B. The core B design does not include a bus interface architecture (e.g., appropriate bypass bus muxes or the inter-core communication wire transceivers) to accommodate dual die operation. For example, the core B design may have a bus interface architecture like that of FIG. 2 of Ser. No. 13/299,014, which describes both a conventional processor core bus interface architecture, which does not accommodate bypass bus communications. Ser. No. 13/299,014 also describes several modified embodiments or processor core bus interfaces that do accommodate bypass bus communications.

Continuing with the more advanced reticle modification embodiment, elements to accommodate bypass bus communications (such as those described in one of the embodiments of Ser. No. 13/299,014 are implemented in an intermediately modified reticle set by using spare transistors and gates of the core B design. In one example involving a 70-layer first reticle set, approximately 25 metal and via layers of the first reticle set are initially modified, and no transistor layers are changed, to enable the cores to accommodate bypass bus communications. The single-core dies that can be manufactured using the initially modified reticle set are referred to as core Y. Five layers in the intermediately modified reticle set are further modified to create a second, fully modified, reticle set for printing a matrix having three single-core Y dies and three dual-core dies referred to as core X. The modified reticle set defines each dual-core die X to have communication wires connecting the two cores. These five layers include the top metal and via layers in which the inter-core communication wires reside and three bump and passivation layers to improve reliability, such as adding dummy bumps in the scribe line region for physical stability.

An extension of the technique described above to convert a dual-core design to a quad-core design will now be described with respect to FIGS. 5 through 8.

Figure 5:
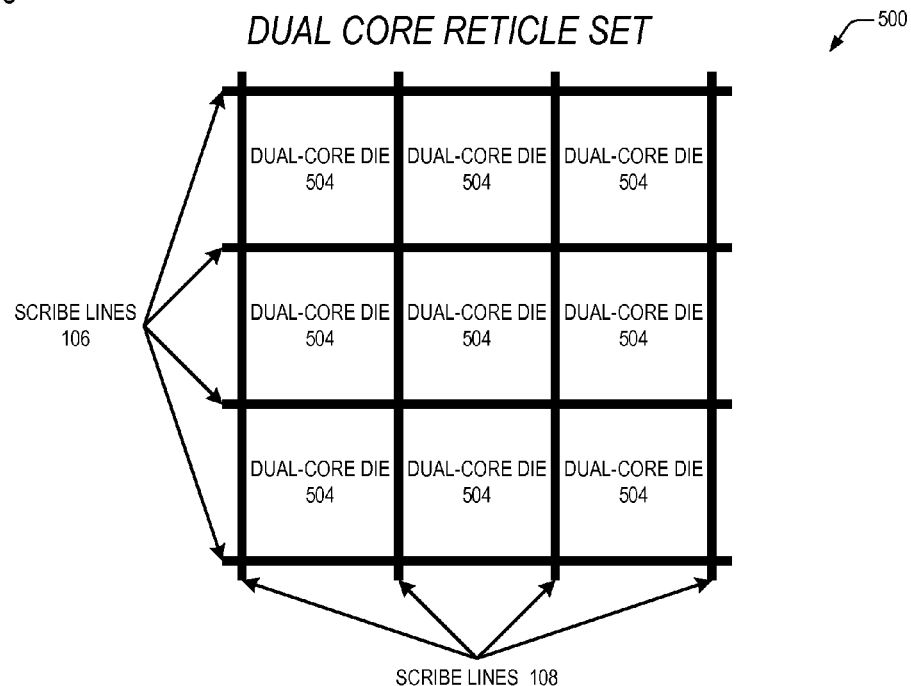
FIG. 5 is a block diagram illustrating a dual-core reticle set used to print a set of dual-core dies on a semiconductor wafer according to the present invention.

Referring now to FIG. 5, a block diagram illustrating a dual-core reticle set 500 used to print a set of dual-core dies 504 on a semiconductor wafer according to the present invention is shown. The dual-core reticle set 500 of FIG. 5 is similar to the dual-core reticle set 100 of FIG. 1 in many respects, except that the individual dies are dual-core dies 504 rather than single-core dies 102. The dual-core reticle set 500 may also be the modified product of an original reticle set 100 designed for single-core dies.

In one embodiment, the dual-core reticle set 500 configures each dual-core die 504 to include native inter-core communication wires between the two cores. The native inter-core wires may embody a relatively comprehensive internal bypass bus, as described, for example, in Ser. No. 13/299,014, or a much smaller set of inter-core communication wires, as described, for example, in Ser. No. 13/299,225, between the two cores of the dual-core die 504. In an alternative embodiment, the dual-core reticle set 500 defines each dual-core die to share a set of landing pads, and to have a bus interface architecture like that of the twin core pair of FIG. 6 of Ser. No. 13/299,014. In another embodiment, the dual-core reticle set 500 defines the dual-core dies 504 with a shared level-2 cache memory.

Figure 6:
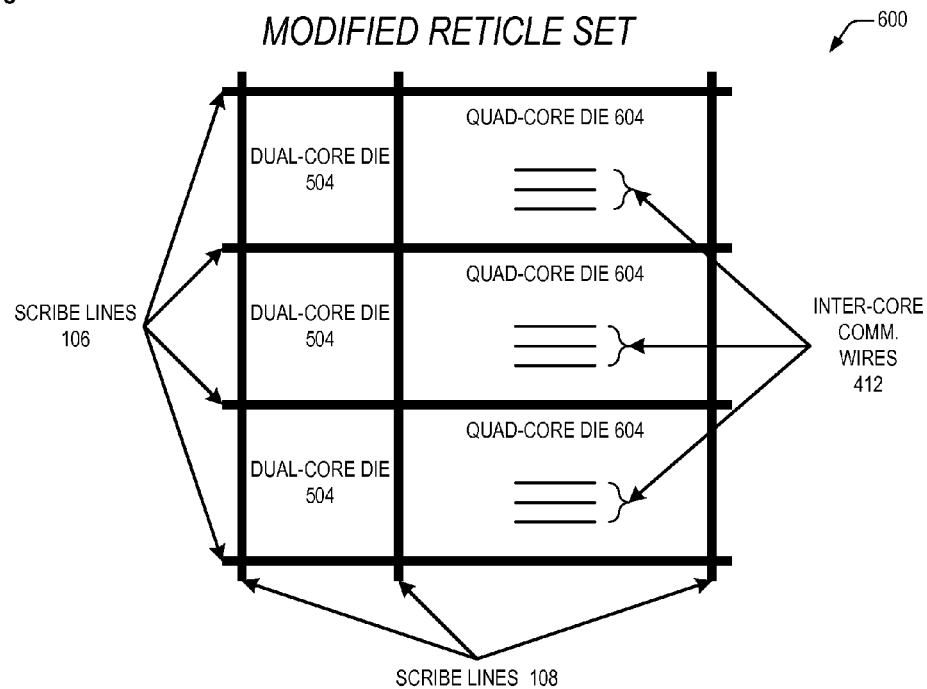
FIG. 6 is a block diagram illustrating a modified reticle set used to print a set of dual-core dies and a set of quad-core dies on a semiconductor wafer according to the present invention.

Referring now to FIG. 6, a block diagram illustrating a modified reticle set 600 used to print a set of dual-core dies 504 and a set of quad-core dies 604 on a semiconductor wafer according to the present invention is shown. Specifically, the embodiment of FIG. 6 illustrates a set of three dual-core dies 504 and a set of three quad-core dies 604. That is, the same number of cores, namely eighteen, may be printed using both the dual-core reticle set 500 of FIG. 5 and the modified reticle set 600 of FIG. 6; however, the dual-core reticle set 500 of FIG. 5 may be used to print nine dies 504, whereas the modified reticle set 600 of FIG. 6 may be used to print six dies: three dual-core dies 504 and three quad-core dies 604. The modified reticle set 600 is similar to the dual-core reticle set 500 of FIG. 5; however, a subset of the individual reticles are modified as described now with respect to the flowchart of FIG. 7 to include (further) inter-core communication wires 412.

Various uses of the (further) inter-core communication wires 412 are described according various embodiments in detail in Ser. No. 13/299,014, Ser. No. 13/299,122, and Ser. No. 13/299,225. Even further uses are described in the sections of Ser. No. 61/426,470, filed Dec. 22, 2010, entitled "Dynamic Multi-Core Microprocessor Configuration" Ser. No. 13/299,207 and "Dynamic and Selective Core Disablement in a Multi-Core Processor" Ser. No. 13/299,239, which are herein incorporated by reference.

In one embodiment, the inter-core communication wires 412 in combination with native inter-core communication wires 212 connect each core in the quad-core die 604 to each other core in the quad-core die 604 to facilitate direct power management communication, in accordance with a collaborative peer-to-peer coordination model, between each pair of cores. Ser. No. 13/299,122 describes both collaborative peer-to-peer coordination and master-mediated coordination models for power management between cores, and FIG. 16 thereof illustrates quad-core dies that are capable of supporting such either coordination model.

In another embodiment, the inter-core communication wires 412 connect only one core in one previously distinct dual-core die 504 with only one core in the other previously distinct dual-core die 504. For example, one core in each of the two previously distinct dual-core dies 504 could act as a "master" for that die, with each master connected with its originally paired core via native inter-core communication wires 412. In this embodiment, an additional set of inter-core communication wires 412 would connect the two masters together. Ser. No. 13/299,122 describes several quad-core dies whose cores are connected in such fashion.

Figure 8:
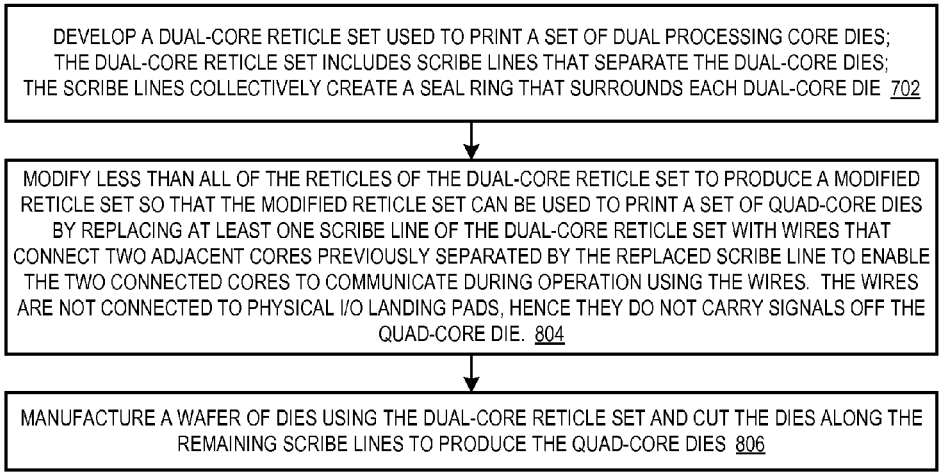
FIG. 8 is a flowchart illustrating steps for modifying the dual-core reticle set of FIG. 5 to produce a modified reticle set for producing all quad-core dies according to the present invention.

In yet another embodiment, a single set of inter-core communication wires 412 connect a twin core pair of one previously distinct dual-core die 504 with a twin core pair of the other previously distinct dual-core die 504. FIG. 8 of Ser. No. 13/299,014 is illustrative of such an embodiment.

In yet another embodiment, two pairs of inter-core communication wires 412 are provided for increased configuration flexibility, redundancy, and/or reliability. A pair of inter-core communication wires 412 connects each core in one previously distinct dual-core die 504 with a "complementary" core in the other previously distinct dual-core die 504. The inter-core communication wires 412 are in addition to the two pairs of native inter-core communication wires 212 connecting the cores of each previously distinct dual-core die 504 together. Ser. No. 13/299,225 describes a processor with two dual-core dies wherein each core of each die is connected in an equivalent fashion. In a corresponding quad-core die embodiment, a complementary architecture analogous to that of Ser. No. 13/299,225 would be applied.

In yet another embodiment, a set of inter-core communication wires 212 would be provided between a designated master core and each of the other three cores. In such an embodiment, the non-master cores of the die would not be connected by inter-core communication wires. In this last embodiment, reticles for such a quad-core die would preferably be developed directly from reticles of a single-core die, rather than from reticles of a dual-core die.

It is noted that although in many of these embodiments, each core of the quad-core die 604 is not enabled to directly communicate with each other core in the quad-core die 604, each core may nevertheless be configured to indirectly communicate with such cores through one or more cores of the quad-core die 604.

Figure 7:
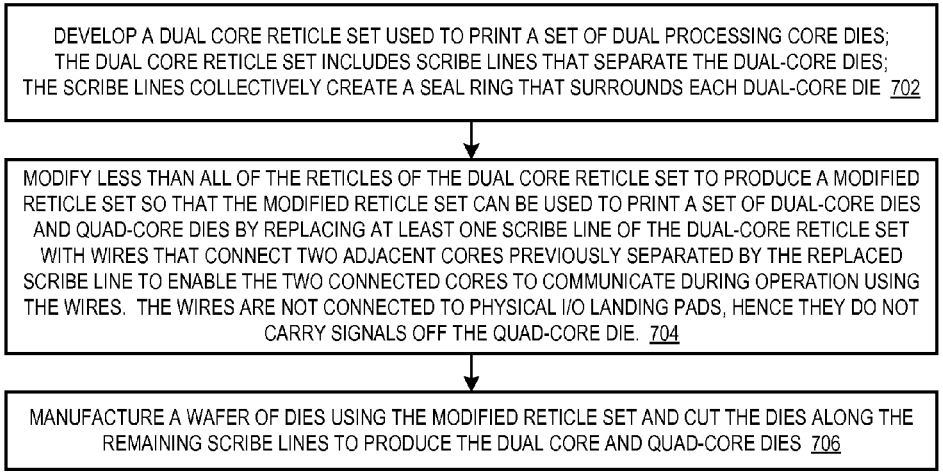
FIG. 7 is a flowchart illustrating steps for modifying the dual-core reticle set of FIG. 5 to produce the modified reticle set of FIG. 6 according to the present invention.

Referring now to FIG. 7, a flowchart illustrating one embodiment of steps for modifying the dual-core reticle set 500 of FIG. 5 to produce the modified reticle set 600 of FIG. 6 according to the present invention is shown. Flow begins at block 702.

At block 702, the designers develop a dual-core reticle set, such as the dual-core reticle set 500 of FIG. 5, for printing a set of dual-core dies, such as the dual-core dies 504 of FIG. 5. The dual-core reticle set defines scribe lines to separate the dual-core dies and to collectively create a seal ring to surround each dual-core die. Flow proceeds to block 704. The dual-core reticle set may itself be the modified product of an original reticle set designed for single-core dies, produced in accordance with blocks 302 and 404 of FIG. 4.

At block 704, the designers modify less than all of the reticles of the dual-core reticle set produced according to block 702 to produce a modified reticle set, such as the reticle set 600 of FIG. 6, so that the modified reticle set can be used to print a set of dual-core dies and a set of quad-core dies, such as the dual-core dies 504 and quad-core dies 604 of FIG. 6. The designers remove at least one scribe line, such as one of the scribe lines 108 of FIG. 5, and modify corresponding portions of the reticle set to define wires, such as the inter-core communication wires 412 of FIG. 6, to connect cores of previously distinctly defined adjacent dual-core dies that would have been separated in accordance with the removed scribe lines, as discussed above with respect to FIG. 6. Stated alternatively, the modification to the reticle subset removes the portion of the seal ring that would have separated two adjacent dual-core dies and defines the inter-core communication wires 412 that allow the two pairs of cores that would have otherwise been separated to communicate with one another (e.g., for power state synchronization or bus bypass purposes, as discussed herein). Thus, because the modified reticle set 600 of FIG. 6 now defines no scribe line 108 between the two previously distinctly defined adjacent dual-core dies, the modified reticle set 600 now defines a single quad-core die 604 comprising what would have been two dual-core dies 504. It is noted that the seal rings are left fully intact between the remaining dual-core dies, such as dual-core dies 504 of FIG. 6. The wires 412 enable the four cores to communicate during operation. The wires 412 are not connected to physical I/O landing pads of the quad-core die; hence, they do not carry signals off the quad-core die. As discussed above, in one embodiment, the dual-core reticle set is a 3×3 matrix of dual-core dies, and the modified reticle set produces three quad-core dies and three dual-core dies. More generally, the dual-core reticle set is an M×N matrix of dual-core dies. If M is an odd number, the modified reticle set produces N×[(M−1)/2] quad-core dies and N dual-core dies, an example of which is shown in the embodiment of FIG. 6. If M is an even number, the modified reticle set produces (N×M)/4 quad-core dies and (N×M)/2 dual-core dies; alternatively, the modified reticle set produces (N×M)/2 quad-core dies, as described with respect to block 804 of the flowchart of FIG. 8. Flow proceeds to block 706.

At block 706, a manufacturer manufactures a wafer of dies using the modified reticle set produced according to block 704. The manufacturer then cuts the dies along the remaining scribe lines to produce the dual-core and quad-core dies. Alternatively, the manufacturer uses the modified reticle set to produce all quad-core dies, as described with respect to block 806 of the flowchart of FIG. 8. Flow ends at block 706.

Referring now to FIG. 8, a flowchart illustrating steps for modifying the dual-core reticle set 500 of FIG. 5 to produce a modified reticle set for producing all quad-core dies according to the present invention is shown. Flow begins at block 702, which is similar to block 702 of FIG. 7; flow proceeds from block 702 to block 804.

At block 804, the designers modify less than all of the reticles of the dual-core reticle set produced according to block 702 to produce a modified reticle set so that the modified reticle set can be used to print a set of quad-core dies, such as the quad-core dies 604 of FIG. 6, by removing at least one scribe line, such as one of the scribe lines 108 of FIG. 5, and modifying corresponding portions of the reticle set to define wires, such as the inter-core communication wires 412 of FIG. 6, that connect cores of previously distinct adjacent dual-core dies that would have been separated by the replaced scribe lines. Stated alternatively, the modification to the reticle subset removes the portion of the seal ring that would have separated two adjacent dual-core dies and defines the inter-core communication wires 412 that allow the two pairs of cores that would have otherwise been separated to communicate with one another (e.g., for power state synchronization purposes or bus bypass purposes, as discussed herein). Thus, because the modified reticle set has no scribe line 108 between the two otherwise distinct adjacent dual-core dies, now a single quad-core die 604 can be created from a modification of a design that defined two dual-core dies 504. The wires 412 enable the four cores to communicate during operation. The wires 412 are not connected to physical I/O landing pads of the quad-core die; hence, they do not carry signals off the quad-core die. The embodiment of FIG. 8 is relevant for modifying a dual-core reticle set that may be used to print an M×N matrix of dual-core dies in which M is an even number such that the modified modified reticle set produces (N×M)/2 quad-core dies. Flow proceeds to block 806.

At block 806, a manufacturer manufactures a wafer of dies using the modified reticle set produced according to block 804. The manufacturer then cuts the dies along the remaining scribe lines to produce the quad-core dies. Flow ends at block 806.

In addition to the advantages mentioned above, another advantage of the design and manufacture method described herein is that it avoids having to add additional physical pads to the dies to create the inter-core communication wires between the cores, or more particularly between the entities that were previously multiple dies that are merged in a single die. This may be observed in more detail with respect to the embodiment of FIGS. 3 and 4 of Ser. No. 13/299,014, which achieves a dual-core microprocessor with improved signal quality afforded by the internal bypass bus and yet avoids having to add additional physical pads to create the bypass bus between the two cores. This provides the benefit of solving the pad-limitedness for a pad-limited design in which the two cores need to communicate.

Although embodiments have been described for quickly modifying reticles to produce dual-core dies and quad-core dies, other embodiments are contemplated in which the techniques described may be employed to quickly modify reticles to produce multi-core dies having larger numbers of cores.

While various embodiments of the present invention have been described herein, it should be understood that they have been presented by way of example, and not limitation. It will be apparent to persons skilled in the relevant computer arts that various changes in form and detail can be made therein without departing from the scope of the invention. For example, software can enable, for example, the function, fabrication, modeling, simulation, description and/or testing of the apparatus and methods described herein. This can be accomplished through the use of general programming languages (e.g., C, C++), hardware description languages (HDL) including Verilog HDL, VHDL, and so on, or other available programs. Such software can be disposed in any known computer usable medium such as magnetic tape, semiconductor, magnetic disk, or optical disc (e.g., CD-ROM, DVD-ROM, etc.), a network, wire line, wireless or other communications medium. Embodiments of the apparatus and method described herein may be included in a semiconductor intellectual property core, such as a microprocessor core (e.g., embodied, or specified, in a HDL) and transformed to hardware in the production of integrated circuits. Additionally, the apparatus and methods described herein may be embodied as a combination of hardware and software. Thus, the present invention should not be limited by any of the exemplary embodiments described herein, but should be defined only in accordance with the following claims and their equivalents. Specifically, the present invention may be implemented within a microprocessor device which may be used in a general purpose computer. Finally, those skilled in the art should appreciate that they can readily use the disclosed conception and specific embodiments as a basis for designing or modifying other structures for carrying out the same purposes of the present invention without departing from the scope of the invention as defined by the appended claims.

I claim:

1. A method for producing a reticle set useable to print multi-core dies on a semiconductor wafer, the method comprising:
    developing a first reticle set usable to print Q-core dies, wherein the first reticle set defines scribe lines to separate the Q-core dies, wherein the scribe lines collectively define a seal ring to surround each Q-core die, wherein Q is at least 1; and
    modifying less than all of the reticles of the first reticle set to produce a second reticle set useable to print P-core dies, wherein said modifying comprises removing of the first reticle set and defining inter-core communication wires to connect at least two adjacent cores that were previously separated by the at least one defined scribe line, wherein P is at least twice Q;

wherein the inter-core communication wires are configured to enable the at least two connected cores to communicate with each other during operation; and wherein the inter-core communication wires are configured to not connect to physical input/output landing pads of the P-core dies, such that each P-core die manufactured in accordance with the modified reticle set will not carry signals through the inter-core communication wires off each P-core die.

2. The method of claim 1, wherein Q is 1 and P is 2.

3. The method of claim 1, wherein Q is 2 and P is 4.

4. The method of claim 1, wherein the first reticle set is usable to print an M×N matrix of Q-core dies, and wherein the second reticle set is usable to print (N×M)/2 P-core dies, when M is an even number at least 2 and N is at least 1.

5. The method of claim 1, wherein said modifying less than all of the reticles of the first reticle set to produce the second reticle set comprises modifying only corresponding reticles for non-transistor layers of the first reticle set.

6. The method of claim 1, wherein said modifying less than all of the reticles of the first reticle set to produce the second reticle set comprises modifying corresponding reticles for fewer than half of all layers of the first reticle set.

7. The method of claim 1, further comprising:
manufacturing a semiconductor wafer of multi-core dies using the second reticle set.

8. The method of claim 7, wherein said manufacturing the semiconductor wafer of multi-core dies using the second reticle set comprises:
printing the multi-core dies on the semiconductor wafer using the second reticle set; and
cutting the multi-core dies on the semiconductor wafer along the remaining scribe lines.

9. The method of claim 1, further comprising defining at least a portion of the inter-core communication wires as an internal bypass bus for bypassing an external bus for interconnecting each multi-core die, to a chipset.

10. The method of claim 9, wherein the at least two connected cores are defined to be configured so that when one of the cores drives the external bus, the other cores listen via the internal bypass bus rather than via the external bus.

11. The method of claim 1, wherein the first reticle set is usable to print an M×N matrix of Q-core dies, and wherein the second reticle set is useable to print both P-core dies and Q-core dies.

12. The method of claim 11, wherein the second reticle set is usable to print N×[(M−1)/2] P-core dies and M Q-core dies, when M is an odd number at least 3 and N is at least 2.

13. The method of claim 11, wherein the second reticle set is usable to print (N×M)/4 P-core dies and (N×M)/2 Q-core dies, when M is an even number at least 4 and N is at least 2.

14. The method of claim 1, further comprising defining at least a portion of the inter-core communication wires to configure the at least two connected cores of each multi-core die to communicate with one another for performing power management of each multi-core die.

15. The method of claim 14, wherein said performing power management of each multi-core die comprises synchronizing power state changes by the cores.

16. The method of claim 14, wherein said performing power management of each multi-core die comprises management of a shared voltage source.

17. The method of claim 14, wherein said performing power management of each multi-core die comprises management of a shared clock source.

* * * * *